United States Patent
Rizzi

(10) Patent No.: US 7,833,880 B2
(45) Date of Patent: Nov. 16, 2010

(54) PROCESS FOR MANUFACTURING MICROMECHANICAL DEVICES CONTAINING A GETTER MATERIAL AND DEVICES SO MANUFACTURED

(75) Inventor: Enea Rizzi, Milan (IT)

(73) Assignee: Saes Getters S.p.A., Lainate MI (IT)

( * ) Notice: Subject to any disclaimer, the term of this patent is extended or adjusted under 35 U.S.C. 154(b) by 144 days.

(21) Appl. No.: 12/094,726

(22) PCT Filed: Nov. 28, 2006

(86) PCT No.: PCT/IT2006/000824

§ 371 (c)(1),
(2), (4) Date: May 22, 2008

(87) PCT Pub. No.: WO2007/066370

PCT Pub. Date: Jun. 14, 2007

(65) Prior Publication Data
US 2008/0293178 A1 Nov. 27, 2008

(30) Foreign Application Priority Data
Dec. 6, 2005 (IT) .......................... MI2005A2343

(51) Int. Cl.
H01L 21/30 (2006.01)
H01L 21/46 (2006.01)

(52) U.S. Cl. ........................ 438/456; 438/473; 438/106; 438/118; 438/119; 438/125

(58) Field of Classification Search .............. 438/50–58, 438/106, 118, 119, 125–127, 455–456, 471, 438/473–477
See application file for complete search history.

(56) References Cited

U.S. PATENT DOCUMENTS

| 4,050,914 | A | * | 9/1977 | Murphy | 313/553 |
| 5,503,285 | A | * | 4/1996 | Warren | 216/2 |
| 5,594,170 | A | | 1/1997 | Peters | |
| 5,656,778 | A | | 8/1997 | Roszhart | |
| 5,821,836 | A | | 10/1998 | Katehi et al. | |
| 5,895,233 | A | | 4/1999 | Higashi et al. | |
| 5,952,572 | A | | 9/1999 | Yamashita et al. | |
| 6,058,027 | A | | 5/2000 | Vargha et al. | |
| 6,313,043 | B1 | * | 11/2001 | Hattori | 438/745 |
| 6,499,354 | B1 | | 12/2002 | Najafi et al. | |
| 6,590,850 | B2 | | 7/2003 | Eldredge et al. | |
| 6,621,134 | B1 | | 9/2003 | Zurn | |
| 6,635,509 | B1 | | 10/2003 | Ouellet | |
| 6,897,551 | B2 | | 5/2005 | Amiotti | |
| 6,923,625 | B2 | | 8/2005 | Sparks | |
| 2004/0248379 | A1 | * | 12/2004 | Maleville et al. | 438/458 |

FOREIGN PATENT DOCUMENTS

WO 2005/047558 A2 5/2005
WO 2006/109343 A2 10/2006

* cited by examiner

*Primary Examiner*—Ha Tran T Nguyen
*Assistant Examiner*—Karen M Kusumakar
(74) *Attorney, Agent, or Firm*—Panitch Schwarze Belisario & Nadel LLP

(57) ABSTRACT

A process is provided for manufacturing micromechanical devices formed by joining two parts together by direct bonding. One of the parts (12) is made of silicon and the other one is made of a material chosen between silicon and a semiconductor ceramic or oxidic material. The joint between the two parts forms a cavity (14) containing the functional elements of the device (11), possible auxiliary elements and a getter material deposit (13).

15 Claims, 2 Drawing Sheets

PROCESS FOR MANUFACTURING MICROMECHANICAL DEVICES CONTAINING A GETTER MATERIAL AND DEVICES SO MANUFACTURED

CROSS-REFERENCE TO RELATED APPLICATIONS

This application is a Section 371 of International Application No. PCT/IT2006/000824, filed Nov. 28, 2006, which was published in the English language on Jun. 14, 2007, under International Publication No. WO 2007/066370 A1, and the disclosure of which is incorporated herein by reference.

BACKGROUND OF THE INVENTION

The present invention relates to a process for manufacturing micromechanical devices containing a getter material and to the devices manufactured through this process. In particular, the invention relates to a process for manufacturing the devices comprising a step of joining together two wafers by melting at the interface therebetween, one of the wafers being made of silicon and the other one being made of a semiconductor, ceramic or oxidic material; the invention relates as well to the final devices and to particular getter materials capable of withstanding the process conditions.

Micromechanical devices are generally known as "Micro-ElectroMechanical Systems" or "MicroOptoElectroMechanical Systems", and with their abbreviations MEMS and MOEMS (in the following reference will only be made to MEMS, by that also meaning MOEMS). These devices are formed of a sealed cavity, inside which micromechanical parts capable of carrying out preset movements or parts capable of interacting with electromagnetic radiation are present, in addition to auxiliary parts and electrical feedthroughs for both the power supply of the device and the transmission of the signal generated by the device to the outside. Examples of such devices are microaccelerometers, described in numerous patents such as U.S. Pat. Nos. 5,594,170; 5,656,778 and 5,952,572; miniaturized resonators, used in the field of telecommunications and particularly in the manufacture of mobile phones, described in U.S. Pat. Nos. 5,821,836 and 6,058,027; or IR miniaturized sensors, an example of which is described in U.S. Pat. No. 5,895,233.

At the end of the manufacturing process, various gases are contained in the cavity of a MEMS, being residual of the process or due to the degassing of the same cavity walls, which may interfere with the MEMS operation: for example, they can modify the thermal conduction in the system thus altering the temperature measure in the case of an IR sensor, that thus needs the best possible degree of vacuum in the cavity. Other MEMS devices do not have such a stringent requirement for extremely high vacuum levels. For instance, in accelerometers a low pressure of gas in the cavity helps to dampen the vibration of the moving part after it has been placed in motion. This allows fast recovery of the "rest" status of the device, making it more quickly ready for further movement detections. To this end, the manufacture of some MEMS foresees the backfilling of the cavity, prior to its sealing, with a given gas (e.g., a noble one) at pressures on the order of thousands of Pascal (Pa). In these cases too, however, it is necessary that the atmosphere in the cavity have a constant pressure and chemical composition, because variations in these parameters could alter the viscosity of the medium around movable parts, thus altering the measurements.

The achievement of very high vacuum degrees or of a constant atmosphere throughout the life of a MEMS device can be assured by introducing into the cavity a getter material, that is, a material capable of removing most non-noble gases. Getter materials usually employed are metals, such as zirconium, titanium or alloys thereof. Preferred is the alloy having the weight percent composition zirconium 80%-cobalt 15%-Rare Earths 5%, sold by SAES Getters S.p.A. under the trademark St 787. The use of getter materials in MEMS devices is described, for instance, in U.S. Pat. Nos. 5,952,572; 6,499,354; 6,590,850; 6,621,134; 6,635,509; and 6,923,625. MEMS are manufactured with technologies derived from the manufacturing of integrated semiconductor circuits, typically consisting of localized depositions of desired materials onto planar supports of glass, of quartz, of a ceramic material (e.g., silicon carbide) or of a semiconductor material (silicon is preferred), and selective removals of parts of layers of different material. In particular, the last generation MEMS, described in the following with reference to FIG. 1, are normally manufactured by welding two parts together, a first part 10 being commonly formed of a planar support, generally of silicon, on which the functional elements 11 and the auxiliary ones (these not shown in the drawing) are built, and a second part 12, which may be made of glass, quartz, ceramic or a semiconductor material, and generally has only the function of closing the device in order to protect the inner elements. As this second part is generally free from functional elements and thereby provides more free space, the getter material 13 is preferably arranged on this part, as described for instance in U.S. Pat. No. 6,897,551. The preferred technique for the deposition of getter material layers in this application is cathodic deposition, commonly known as "sputtering." As known in this technique, a body, generally having a short cylinder shape (called "target") made of the material intended to be deposited, and the support on which to form the deposit are arranged in a sealed chamber. The chamber is filled with a noble gas, generally argon, at a sub atmospheric pressure. By applying a potential difference of the magnitude of thousands of volts (or lower, depending on the configuration used) between the target (held at cathodic potential) and an anode, the noble gas is ionized and the ions so produced are accelerated towards the target, thus eroding it by impact. The eroded material deposits on the available surfaces, including the support. By employing masking systems provided with suitable openings, it is possible to restrict the area of the support where the deposit has to be formed. As an alternative, sputtering can be carried out under reactive conditions, namely, adding to the noble gas small percentages of a reactive gas, oxygen for instance, which reacts with the particles eroded by the target in gaseous phase, producing a deposit of the material that results from the reaction of the reactive gas with the particles. Once all the elements needed for the operation of the MEMS have been formed on the two parts, these are joined together by welding them along a line enclosing the elements of the device. The micro-device is thus sealed in a closed space 14 and is mechanically and chemically protected from the outer environment.

The welding can be accomplished by numerous techniques, known by the common definition of "bonding." A first possibility consists in inserting between the two parts a malleable metal, such as indium, lead or gold, and causing this to melt and solidify, possibly while exerting pressure ("pressure bonding"). However, this technique results in not completely reliable weldings from the mechanical strength point of view. Another type of bonding is anodic bonding (mainly employed where one of the supports is made of glass or quartz and the other one is of silicon), wherein a potential difference of about 1000 V is applied between the two parts kept at a temperature of about 300-500° C. Under these conditions there is a migration of positive ions from the support kept at positive potential (e.g., sodium ions from the glass) toward the support kept at negative potential, and a migration of negative ions (e.g., oxygen from silicon) to the opposite direction. This material migration between the two supports results in the mutual welding thereof. Another possible technique is eutectic bonding, wherein a layer of metal or alloy, able to form a eutectic composition with the material of at least one of the two supports, is interposed between the two supports, so as to cause a localized melting in the welding area by a suitable thermal treatment. However, the eutectic bonding is not generally used when there are dangers of metallic contamination, e.g., when the eutectic bonding is carried out together with cMOS manufacturing processes. The getter materials presently available are those compatible with MEMS manufacturing processes, which use the above-described bonding techniques.

Another possible MEMS sealing technique is direct bonding, requiring the localized melting of the material of the supports. Achievement of a stable bonding through this technique generally requires high temperatures, e.g. about 1000° C. in the case of silicon. This technique can also use an intermediate layer, e.g. silicon oxide when bonding two silicon parts. Compared to the previously cited techniques, direct bonding allows a better bonding between the two parts to be welded, increasing both the adhesion force and the stability with respect to stress conditions, such as thermal and mechanical shocks, vibrations or thermal cycles. With such a type of bonding, the mechanical characteristics of the welding area are comparable with those of the material forming the welded parts. This type of bonding is used for devices which must have great reliability and durability (e.g., avionic applications).

However, it has been verified that getter materials used at present are not capable of withstanding the thermal treatments required by direct bonding. First, during these thermal treatments most getter materials undergo strong structural and morphological rearrangements, which may result in melting of the material deposit (e.g., in the case of the cited St 787 alloy). The minimum consequence observed is the nearly total loss of the gas sorption ability by the getter, while in the case of melting the getter material can "wet" the functional parts of the device and, after solidification, it can completely alter or prevent the operation thereof. In some cases, a partial evaporation and new condensation of the getter material on the adjacent surfaces has also been observed, with negative consequences on operation of the device. Another problem that has been observed with all the getter materials is that, if the deposit is formed on silicon, it detaches from the support during the cooling that follows the bonding operation, so that solid fragments can come into contact with the functional parts, thus jeopardizing efficiency of the device.

BRIEF SUMMARY OF THE INVENTION

An object of the present invention is to provide a process for manufacturing micromechanical devices comprising a step of direct bonding of two support parts on which functional elements, accessories and a getter material are present, as well as to provide final micromechanical devices and a family of getter materials capable of withstanding the manufacturing process.

These objects are achieved according to the present invention with a process for manufacturing micromechanical devices comprising a step of direct bonding of two support parts, one of which is made of silicon and the other one being made of silicon or of a semiconductor, ceramic or oxidic material, wherein functional elements and possible auxiliary elements of the device are present on at least one of the support parts, and wherein a getter material deposit is present on a silicon support part. The method comprises the steps of: providing a first support part where functional elements and possible auxiliary elements of the device are built; providing a second support part; the first and second support parts being formed such that, when mating, they form a cavity wherein the functional elements, auxiliary elements and getter material deposit are housed; approaching the two support parts toward each other, so as to form the cavity; and welding the two support parts by direct bonding. The process is characterized in that the getter material deposit is formed on the silicon support part by a first operation of forming on the silicon support part an intermediate layer of a vitreous, ceramic or oxidic material having thickness of at least 50 nanometers, and a second operation of depositing a getter material layer having thickness not higher than 10 micrometers onto the intermediate layer; and in that the getter material employed is an alloy containing zirconium and at least a second element chosen among molybdenum, niobium, tantalum and tungsten, wherein zirconium is present in percentage between 70 and 97% by weight.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

The inventors have found that it is possible to prevent the getter material deposits on silicon supports from detaching during a direct bonding process, if some particular getter materials are used, if between the getter material and silicon is interposed an intermediate layer made of a vitreous, ceramic or oxidic material, and if the getter and intermediate layers have particular thickness values. As the process of the invention is characterized by the presence of the intermediate layer and by the definition of the thicknesses, while the remaining operations are completely similar to other MEMS manufacturing processes with direct bonding, only the innovative features of the process will be described in detail in the following.

As previously described, due to available space reasons, it is preferable to produce the getter layer on the support opposite to the one where MEMS functional and auxiliary elements are built. Therefore, in the rest of the description reference will be made to this embodiment, but it will be evident to those skilled in the art that the invention can also be applied where the getter deposit is obtained on the same support carrying the functional and auxiliary elements.

The formation of the intermediate layer and of the getter material layer thereon can be carried out by various techniques. For example, the intermediate layer may be made of a vitreous or ceramic silicon compound, e.g. oxide or nitride. In this case, such layer can be allowed to grow starting from the silicon support by reaction with oxygen or nitrogen at a sufficient temperature, or alternatively it is possible to adopt the technique of oxygen or nitrogen ion implantation into silicon, followed by thermal treatments of diffusion (known in the field as "annealing") to render the so formed layer homogeneous as to structure and characteristics.

However, the preferred technique for the growth of the various layers is sputtering, possibly reactive, offering a high control of the geometric and structural characteristics of the layer under formation at a limited cost. Further, with respect to the previously cited techniques, sputtering gives the additional advantage of being able to form intermediate layers suitable for the purposes of the invention with materials different from silicon compounds, such as metal nitrides or carbides.

The preferred manner of carrying out the process of the invention (deposit by sputtering of both intermediate and getter material layers on the support free from functional elements) is described in the following with reference to FIG. 2, wherein the elements are shown in a schematic sectional view.

Figure 1:
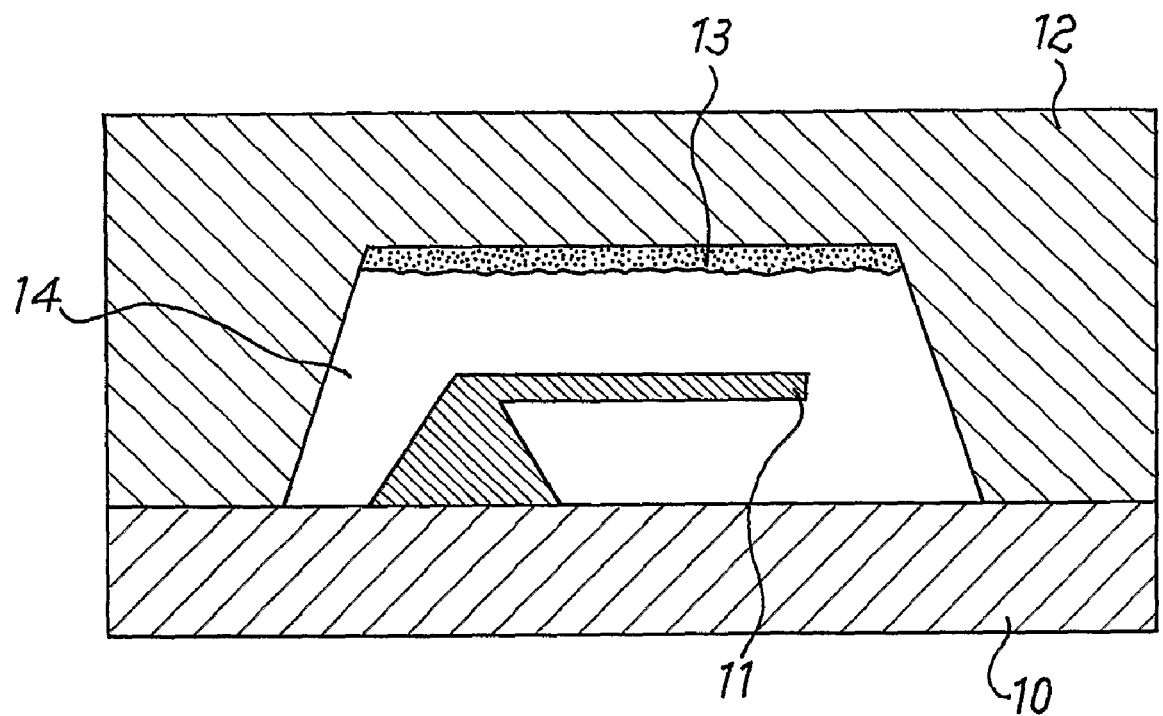
FIG. 1 is a schematic sectional view of a MEMS device according to the prior art.

FIG. 2a shows a support 20, similar to support 12 of FIG. 1 but having an upside-down orientation with respect thereto.

FIG. 2b shows the forming operation of the intermediate layer onto support 20. The deposition is preferably carried out on a restricted area of support 20, by positioning a mask 21 over the support, the mask having an opening 22 defining the area of support 20 where the deposit is to be formed. The arrows in FIG. 2b indicate the direction of the particles of the material chosen for the formation of the intermediate layer 23. The thickness of the intermediate layer can be controlled, as is well known in the field, by adjusting the process time, the power applied between anode and target and the distance between the target of the material to be deposited and support 20. The thickness of layer 23 must be at least 50 nanometers (nm), because it has been observed that with lower thicknesses the detachment of the getter layer subsequently formed cannot be prevented. Preferably, this thickness is lower than 2 µm, in order to minimize the time of deposition of the intermediate layer, still ensuring optimal functional characteristics. The deposition of layer 23 by sputtering can also be carried out under reactive conditions, for instance in the presence of small amounts of oxygen in the noble gas, yielding an oxide as the material forming such layer.

The forming operation of the intermediate layer can be carried out also in other ways, for example without using the mask 21 in the deposition phase, by uniformly depositing the material of layer 23 onto support 20 and then selectively removing it in order to obtain the desired geometry. In this case, the use of a mask may be required for the operation of selective removal of portions of the thus deposited layer.

The subsequent operation is the deposition of the getter material layer. This operation can be carried out also without using masking, by uniformly depositing the material on support part 20 (where layer 23 is already present) and then selectively removing the getter, so as to leave it only in correspondence to layer 23. However, in this case also the getter material layer deposition is preferably carried out by using a masking system, so that the getter material deposits only onto the intermediate layer. The mask may have an opening that is smaller than that employed in the operation shown in FIG. 2b, but preferably the size, shape and alignment of the opening are the same as those of the previous operation, in order to maximize the getter deposit area (and thereby its gas sorbing ability). These preferred conditions are accomplished in the most convenient way by employing the same mask, kept in constant alignment with respect to support part 20 in the two operations, thus simplifying the whole process. By using the same mask for the two deposition operations, these are consecutively carried out during the same manufacturing step by simply replacing the target of the intermediate layer material with the getter material target, by adjusting the time of using the two targets on the basis of the desired thicknesses for the two layers of different materials. This mode is represented in FIG. 2c, wherein the same mask 21 of FIG. 2b, with opening 22, is used to deposit the getter material layer 24. In this case also the arrows indicate the direction of the getter material particles being deposited.

Figure 2:
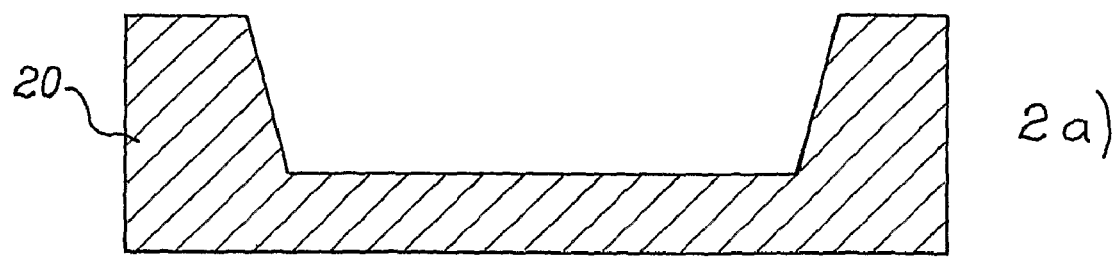
FIGS. 2a, 2b and 2c are schematic sectional views illustrating the main steps of an embodiment of the process of the invention.
Figure 2:
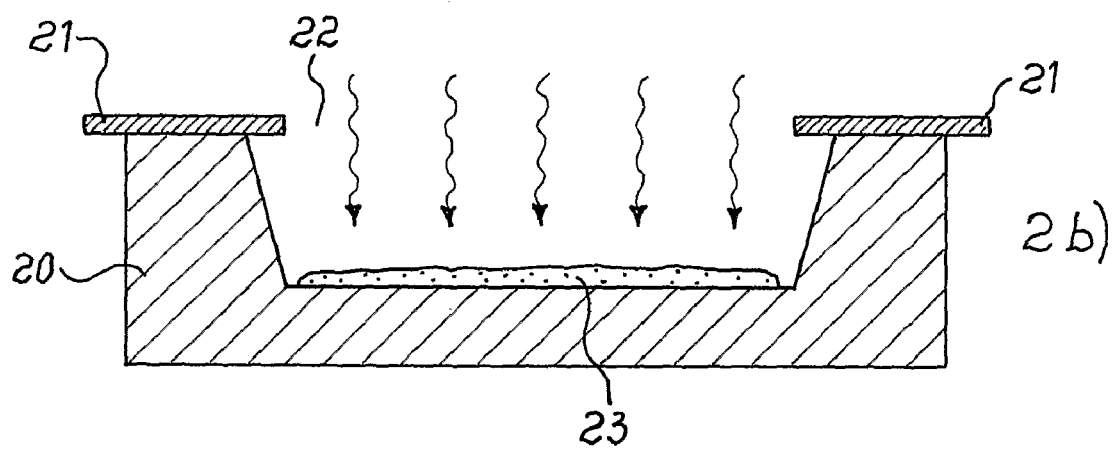
Figure 2:
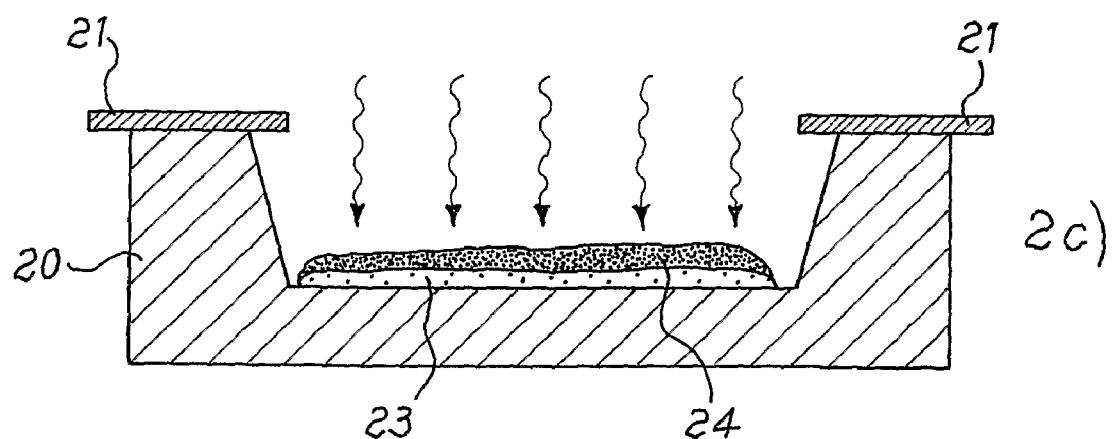

In FIG. 2 mask 21 is represented as a physical object laid over support part 20. This choice is possible when the deposits to be formed have lateral dimensions not lower than about 200-300 micrometers. Below these dimensions it is necessary to resort to lithographic masks, obtained by deposition on the support of films of UV-sensible organic materials, exposure to UV light and selective removal with chemicals of exposed (or non-exposed) portions of the films, according to a procedure well known in the field of microelectronics and that can be applied to the deposition of getter materials, as described in International patent application publication WO 2006/109343 of SAES Getters S.p.A.

The getter material compatible with the direct bonding operation is an alloy containing zirconium and at least a second element chosen among molybdenum, niobium, tantalum, and tungsten, wherein zirconium is present in percentages comprised between 70 and 97% by weight. Preferably, the second element is chosen between niobium and tantalum, and in this case zirconium is present in percentages comprised between 85 and 95% by weight.

The thickness of the getter material layer must not exceed 10 µm, because the inventors have experimentally observed that for higher thicknesses the getter deposit detaches from the support during direct bonding (in particular, during the cooling following the bonding), despite the presence of the intermediate layer and independently of the thickness of the latter. The thickness of this layer is preferably larger than 0.1 µm, as for lower thicknesses the gas sorbing ability becomes too low.

The so-prepared support part 20, with the addition of layers 23 and 24, then undergoes the subsequent operations of the MEMS manufacturing process, in particular the direct bonding with a support like support part 10. As known in the field, in order to ensure a good quality of the direct bonding, it is preferable that the two surfaces to be welded together be preliminarily subjected to cleaning and surface modification treatments, such as mechanical polishing, lapping or chemical washings. These treatments are preferably carried out before the deposition steps of the intermediate and getter layers, but they could also be carried out after the deposition steps, as described in the International patent application publication WO 2005/047558 of SAES Getters S.p.A. The sealing step can also be carried out in the presence of a given gas (e.g., a noble gas) at sub-atmospheric pressure, in order to obtain a MEMS device having a fixed gas pressure in the cavity, for the reasons explained before.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A process for manufacturing a micromechanical device comprising two support parts, one of which (12, 20) comprises silicon and the other of which comprises silicon or a semiconductor, ceramic or oxidic material, functional elements (11) and optional auxiliary elements present on at least one of the support parts, and a getter material deposit (13, 24) present on one silicon support part, the method comprising the steps of: providing a first support part (10) on which the functional elements (11) and optional auxiliary elements of the device are built; providing a second support part (20); the first and second support parts being formed such that, when mating, they form a cavity (14) wherein the functional elements, optional auxiliary elements and getter material deposit are housed; approaching the two support parts so as to form the cavity and welding the two support parts by direct bonding; wherein the getter material deposit is formed on the silicon support part by a first operation of forming on the silicon support part an intermediate layer (23) of a vitreous, ceramic or oxidic material having thickness of at least 50 nanometers, and a second operation of depositing a getter material layer (24) having thickness not greater than 10 micrometers onto the intermediate layer; and wherein the getter material comprises an alloy containing zirconium and at least a second element selected from molybdenum, niobium, tantalum and tungsten, wherein zirconium is present in the alloy in a proportion between 70 and 97% by weight.

2. The process according to claim 1, wherein the second element is selected from niobium and tantalum, and zirconium is present in the alloy in a proportion between 85 and 95% by weight.

3. The process according to claim 1, wherein the intermediate layer comprises silicon oxide or nitride and is formed by reaction of the silicon support part with oxygen or nitrogen.

4. The process according to claim 1, wherein the intermediate layer comprises silicon oxide or nitride and is formed by oxygen or nitrogen ion implantation into silicon.

5. The process according to claim 4, wherein the ion implantation is followed by thermal treatments of oxygen or nitrogen diffusion into silicon.

6. The process according to claim 1, wherein the intermediate layer is formed bt cathodic deposition.

7. The process according to claim 6, wherein the cathodic deposition takes place under reactive conditions.

8. The process according to claim 6, wherein the cathodic deposition is carried out on a restricted area of the silicon support part (20) by placing onto the support part a mask (21) with an opening (22) that defines an area of the silicon support part where the deposit will be formed.

9. The process according to claim 1, wherein the operation of deposition of the getter material layer (24) occurs by cathodic deposition.

10. The process according to claim 9, wherein the operation of deposition of the getter material layer (24) is carried out only onto the intermediate layer by placing on the silicon support part (20) a first mask having an opening with a size smaller than or equal to an opening of a second mask used in formation of the intermediate layer, and by aligning the first mask to the silicon support part (20) such that the getter material deposits on the intermediate layer only.

11. The process according to claim 10, wherein the forming operations of the intermediate and getter material layers occur by employing the first and second masks as a same mask (21) with constant alignment with respect to the silicon support part (20).

12. The process according to claim 1, wherein the getter material layer has a thickness between 0.1 and 10 µm.

13. The process according to claim 1, wherein surfaces of the two support parts to be welded together are subjected to cleaning and surface modification treatments before welding.

14. The process according to claim 13, wherein the treatments are selected from mechanical polishing, lapping and chemical washings.

15. The process according to claim 1, wherein the step of welding the two support parts by direct bonding is carried out in the presence of a noble gas at sub-atmospheric pressure.

* * * * *